United States Patent
Seon

(10) Patent No.: US 12,482,965 B2
(45) Date of Patent: Nov. 25, 2025

(54) CONNECTOR DEVICE

(71) Applicant: LG Energy Solution, Ltd., Seoul (KR)

(72) Inventor: Sang Ok Seon, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 358 days.

(21) Appl. No.: 18/006,298

(22) PCT Filed: Aug. 13, 2021

(86) PCT No.: PCT/KR2021/010823
§ 371 (c)(1),
(2) Date: Jan. 20, 2023

(87) PCT Pub. No.: WO2022/050593
PCT Pub. Date: Mar. 10, 2022

(65) Prior Publication Data
US 2023/0307855 A1 Sep. 28, 2023

(30) Foreign Application Priority Data
Sep. 2, 2020 (KR) .................. 10-2020-0111915

(51) Int. Cl.
*H05K 7/10* (2006.01)
*H01R 12/70* (2011.01)
(Continued)

(52) U.S. Cl.
CPC ......... *H01R 12/7005* (2013.01); *H01R 12/75* (2013.01); *H01R 13/6271* (2013.01)

(58) Field of Classification Search
CPC .................................................. H01R 13/629
See application file for complete search history.

(56) References Cited

U.S. PATENT DOCUMENTS 4,152,038 A * 5/1979 Inouye .................. H01R 12/88
439/153
4,537,454 A * 8/1985 Douty .............. H01R 13/62994
439/157
(Continued)

FOREIGN PATENT DOCUMENTS

CN 202259947 U 5/2012
CN 207426301 U 5/2018
(Continued)

OTHER PUBLICATIONS

International Search Report for Application No. PCT/KR2021/010823 mailed Nov. 23, 2021, 2 pages.
(Continued)

*Primary Examiner* — Neil Abrams
(74) *Attorney, Agent, or Firm* — Lerner David LLP

(57) ABSTRACT

The present invention provides a connector device comprising: a first connector which is fastened to a substrate, and comprises a terminal body having an opening provided in one surface thereof and a terminal provided in the opening and electrically connected to the substrate; a second connector which is fastened to an electric wire, and comprises a socket body inserted into the opening of the terminal body and a socket provided inside the socket body and contacting the terminal; and a ratchet part by which the first connector and the second connector are coupled so as not to be separated or uncoupled so as to be separable. The ratchet part comprises a toothed gear, a ratchet gear, and a stopper.

14 Claims, 8 Drawing Sheets

(51) Int. Cl.
  *H01R 12/75*   (2011.01)
  *H01R 13/627*  (2006.01)

(56) References Cited

U.S. PATENT DOCUMENTS

| 4,931,907 | A | 6/1990 | Robinson et al. | |
| 11,047,407 | B2* | 6/2021 | Wang | H05K 7/1409 |

FOREIGN PATENT DOCUMENTS

| JP | S53128888 | U | 10/1978 |
| JP | S63099788 | U | 6/1988 |
| JP | H05043485 | U | 6/1993 |
| JP | H07032046 | B2 | 4/1995 |
| JP | H09204961 | A | 8/1997 |
| JP | H10334994 | A | 12/1998 |
| JP | 2597876 | Y2 | 7/1999 |
| JP | 2004199905 | A | 7/2004 |
| JP | 2008112678 | A | 5/2008 |
| JP | 2013098055 | A | 5/2013 |
| JP | 2019003812 | A | 1/2019 |
| KR | 19950012809 | A | 5/1995 |
| KR | 19980059217 | U | 10/1998 |
| KR | 20090073906 | A | 7/2009 |
| KR | 101025594 | B1 | 3/2011 |
| KR | 200453565 | Y1 | 5/2011 |
| KR | 200463785 | Y1 | 12/2012 |
| KR | 200466204 | Y1 | 4/2013 |
| KR | 20140040319 | A | 4/2014 |
| KR | 20180028123 | A | 3/2018 |
| KR | 20190050076 | A | 5/2019 |
| KR | 20190085483 | A | 7/2019 |

OTHER PUBLICATIONS

Extended European Search Report for Application No. 21864554.7 dated Nov. 14, 2023. 7 pgs.

* cited by examiner

CONNECTOR DEVICE

CROSS-REFERENCE TO RELATED APPLICATION

The present application claims the benefit of the priority of Korean Patent Application No. 10-2020-0111915, filed on Sep. 2, 2020, which is hereby incorporated by reference in its entirety.

TECHNICAL FIELD

The present invention relates to a connector device in which the coupling between a first connector provided with a terminal and a second connector provided with a socket is enhanced.

BACKGROUND ART

Generally, connector devices are to connect electric wires and devices such as vehicles or home appliances, which use electricity, in a manner so as to conduct electricity or to separate the same, and comprise a first connector which is provided on a substrate of a device and a second connector which is coupled to the first connector and to which an electric wire is connected.

In the connector device having the above configuration, power is supplied to the substrate of the device via the electric wire when the first connector and the second connector are coupled, and the power supplied to the substrate of the device via the electric wire is cut off when the first connector and the second connector are separated.

However, in a connector device according to the related art, the first connector and the second connector are coupled by a locking groove and a locking part. In this case, the first connector and the second connector are not conveniently separated. Also, when the first connector and the second connector are simply coupled without the locking groove and the locking part, they are very easily separated.

DISCLOSURE OF THE INVENTION

Technical Problem

An object of the present invention is to provide a connector device which utilizes a ratchet gear and may couple a first connector and a second connector so as not to be easily separated or uncouple the first connector and the second connector so as to be conveniently separable.

Technical Solution

In order to achieve the above object, a connector device of the present invention comprises: a first connector which is fastened to a substrate, and comprises a terminal body having an opening provided in one surface thereof and a terminal provided in the opening and electrically connected to the substrate; a second connector which is fastened to an electric wire, and comprises a socket body inserted into the opening of the terminal body and a socket provided inside the socket body and contacting the terminal; and a ratchet part by which the first connector and the second connector are coupled so as not to be separated or uncoupled so as to be separable. The ratchet part may comprise: a toothed gear which is provided on an outer surface of the socket body and has teeth provided in a direction toward the terminal body when the socket body is inserted into the terminal body; a ratchet gear which is provided in the terminal body and engages with the toothed gear, and couples the first connector and the second connector so as not to be separated when fixed and uncouples the first connector and the second connector so as to be separable when rotating; and a stopper by which the ratchet gear is fixed so as not to rotate or unfixed so as to be rotatable.

As a front end of the stopper is inserted into a groove between gear teeth of the ratchet gear, the ratchet gear may be allowed to rotate only in a direction in which the second connector and the first connector are coupled.

The ratchet part may further comprise a spring that provides an elastic force to maintain a state in which the stopper is inserted into a groove between gear teeth of the ratchet gear.

When the first connector and the second connector are coupled, the ratchet gear may be rotated by the toothed gear in a direction in which the first connector and the second connector are coupled. The ratchet gear may rotate while pushing the front end of the stopper outward from the groove between the gear teeth of the ratchet gear and thus may rotate without interference by the stopper, and the stopper may continuously move from a groove to another groove between the gear teeth of the ratchet gear while being pulled in a direction toward the ratchet gear by the elastic force of the spring.

When the first connector and the second connector are separated in a state in which the stopper is inserted into the groove between the gear teeth of the ratchet gear, the ratchet gear may be rotated by the toothed gear in a direction in which the first connector and the second connector are separated. The ratchet gear may press the front end of the stopper inward from the groove between the gear teeth of the ratchet gear and thus may not rotate because the front end of the stopper does not escape from the groove between the gear teeth of the ratchet gear, and as the toothed gear is not moved by the ratchet gear, the first connector and the second connector may not be separated.

When the first connector and the second connector are separated in a state in which the stopper escapes from the groove between the gear teeth of the ratchet gear, the ratchet gear may continuously rotate because the stopper escapes from the groove between the gear teeth of the ratchet gear, and as the toothed gear is moved by rotation of the ratchet gear, the first connector and the second connector may be separated.

The ratchet part may further comprise a ratchet body which is detachably coupled to the terminal body and on which the ratchet gear, the stopper, and the spring are installed.

A guide groove may be formed inside the terminal body, and a guide protrusion guided along the guide groove may be formed in the socket body.

A locking groove connected to the guide groove may be formed in one surface of the terminal body in which the guide groove is formed, and a locking protrusion locked and supported by the locking groove may be formed in the guide protrusion.

The toothed gear may be detachably installed on the socket body.

The first connector may further comprise a protection cover that protects the ratchet gear and the stopper provided in the terminal body.

One end of the protection cover may be rotatably coupled to the terminal body.

The stopper may comprise a guide piece, which is installed on an outer circumferential surface of the terminal body and is slidable in a direction toward the ratchet gear, and a fixing piece, which is inserted into a groove between gear teeth of the ratchet gear and fixes the ratchet gear so as not to rotate.

Advantageous Effects

The connector device of the present invention comprises the first connector, the second connector, and the ratchet part, and the ratchet part comprises the toothed gear, the ratchet gear, and the stopper. Due to this feature, the first connector and the second connector may be coupled so as not to be separated or may be uncoupled so as to be conveniently separable. As a result, the safety and convenience may be enhanced.

Also, in the connector device of the present invention, as the front end of the stopper is inserted into the groove between gear teeth of the ratchet gear, the ratchet gear is allowed to rotate only in the direction in which the second connector and the first connector are coupled. Due to this feature, the first connector and the second connector may be separated only when the stopper is separated from the ratchet gear. Accordingly, it is possible to prevent an accident in which the first and second connectors are easily separated by an external force.

MODE FOR CARRYING OUT THE INVENTION

Figure 1:
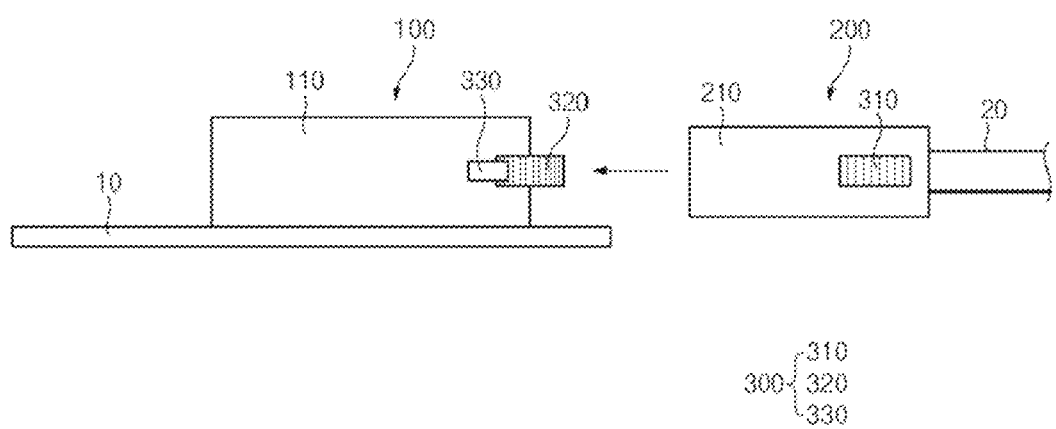
FIG. 1 is a side view schematically illustrating a connector device according to a first embodiment of the present invention.
Figure 2:
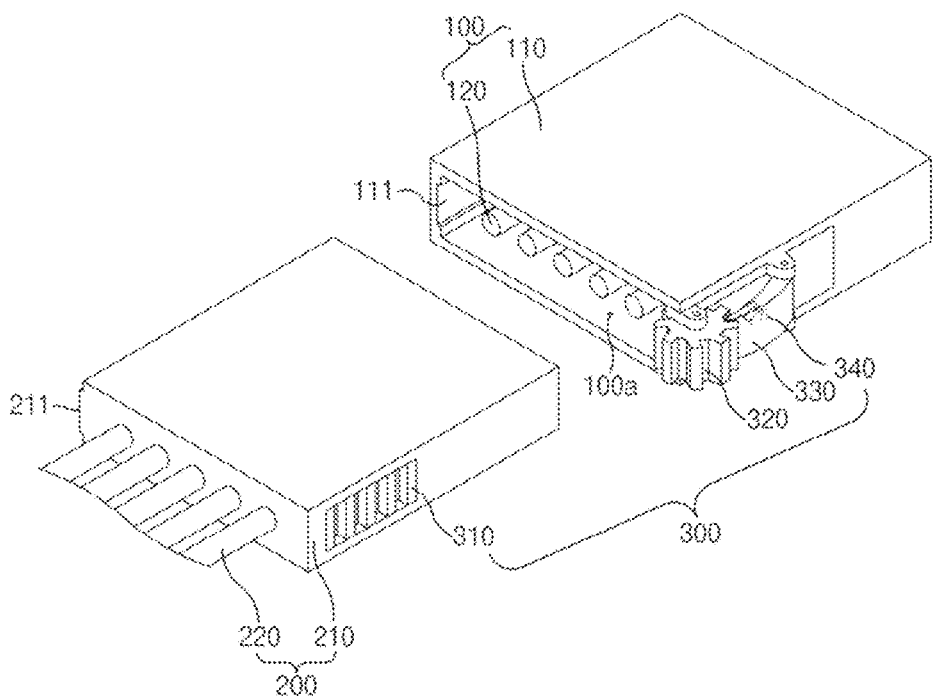
FIG. 2 is a perspective view illustrating a state before first and second connectors are coupled in the connector device according to the first embodiment of the present invention.

Hereinafter, embodiments of the present invention will be described in detail with reference to the accompanying drawings so as to be easily carried out by a person skilled in the art to which the present invention pertains. However, the present invention may be embodied in various different forms, and is not limited to the embodiments described herein. Also, in the drawings, parts irrelevant to the description will be omitted to clearly describe the present invention, and similar elements will be designated by similar reference numerals throughout the specification.

Meanwhile, in the present invention, a connector device having a structure for connecting a substrate and an electric wire is described as one embodiment. However, a connector device for connecting an electronic device to an electronic device and an electric wire to an electric wire may also be applied in the same manner.

Connector Device According to a First Embodiment of the Present Invention

The connector device according to the first embodiment of the present invention may have a coupling structure using a ratchet as illustrated in FIGS. 1 to 5. That is, the connector device according to the first embodiment of the present invention comprises a first connector 100, a second connector 200, and a ratchet part 300 which couples or separably uncouples the first connector 100 and the second connector.

First Connector

The first connector 100 is fastened to a substrate 10, and comprises a terminal body 110 having an opening 100a provided in one surface thereof and a terminal 120 provided in the opening 100a and electrically connected to the substrate 10.

Second Connector

The second connector 200 is fastened to an electric wire 20, and comprises a socket body 210 inserted into the opening 100a of the terminal body 110 and a socket 220 provided inside the socket body 210 and contacting the terminal 120.

Ratchet Part

The ratchet part 300 couples the first connector and the second connector so as not to be separated or uncouples the same so as to be conveniently separable, and comprises a toothed gear 310, a ratchet gear 320, a stopper 330, and a spring 340.

Figure 3:
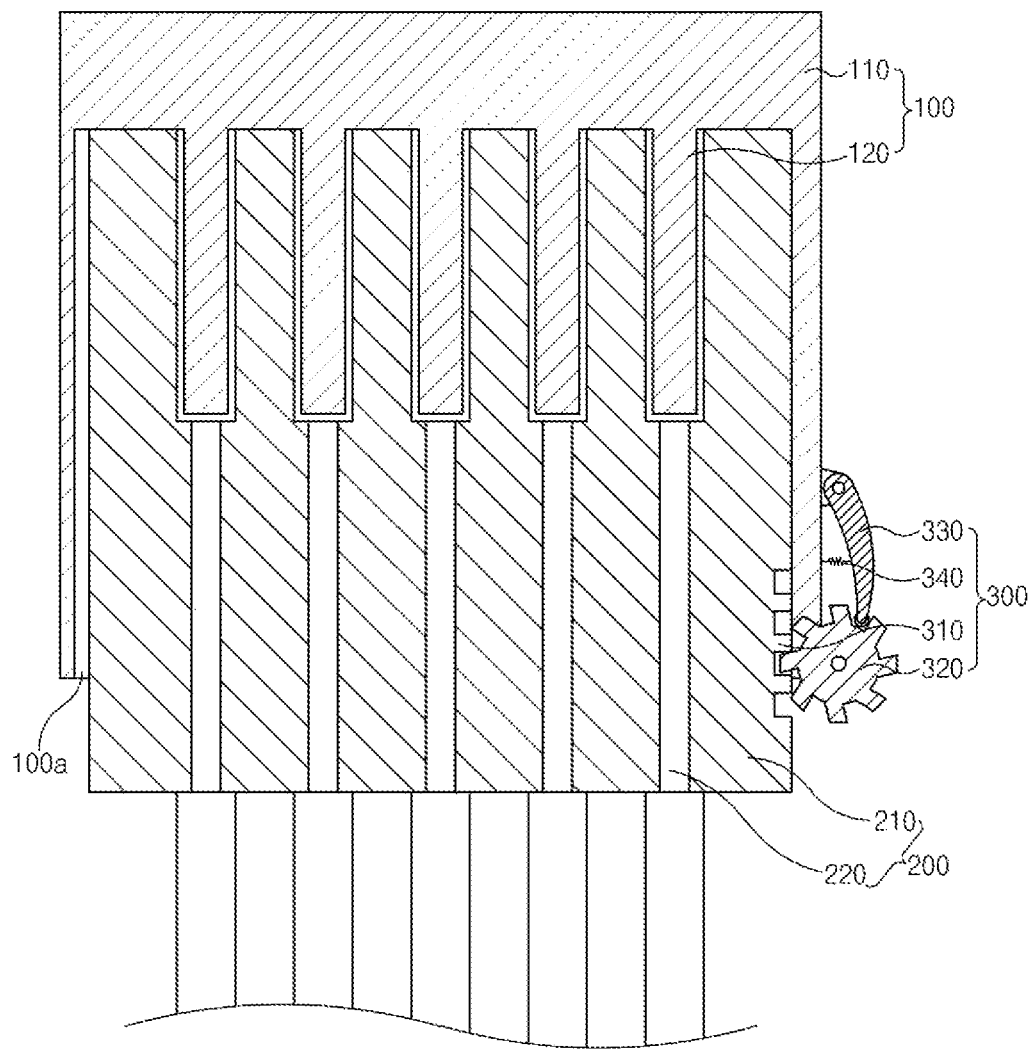
FIG. 3 is a cross-sectional view illustrating a state after the first and second connectors are coupled in the connector device according to the first embodiment of the present invention.

The toothed gear 310 is provided on the outer surface (the outer surface on the outside of the socket body when viewed in FIG. 3) of the socket body 210 and comprises a plurality of teeth.

The teeth are provided in a direction (the up-down direction when viewed in FIG. 3) toward the terminal body 110 when the socket body 210 is inserted into the terminal body 110, and a plurality of teeth are provided at certain intervals.

The ratchet gear 320 is freely rotatably provided in the terminal body 110 and engages with the toothed gear 310 when the first connector 100 and the second connector 200 are coupled, and couples the first connector 100 and the second connector 200 so as not to be separated when fixed and uncouples the first connector 100 and the second connector 200 so as to be separable when rotating.

That is, when the ratchet gear 320 rotates, the first connector 100 and the second connector 200 may be coupled or separated as the toothed gear 310 engaging with the ratchet gear 320 moves. Also, when the ratchet gear 320 is fixed, the first connector 100 and the second connector 200 may be fixed in a coupled state as the toothed gear 310 engaging with the ratchet gear 320 does not move.

Figure 4:
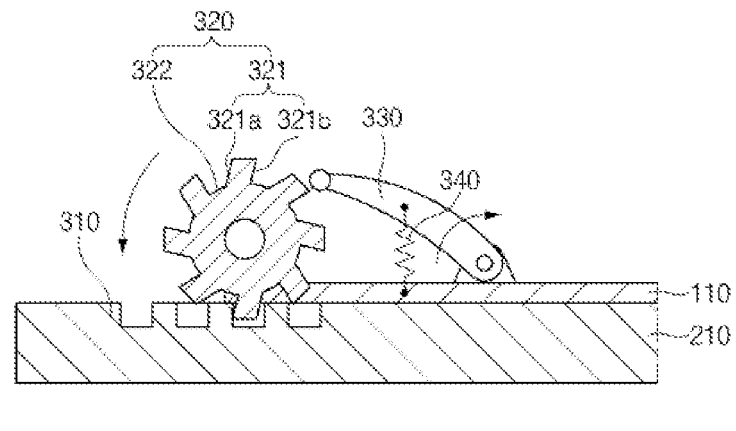
FIG. 4 is a side view illustrate a state in which a ratchet part is being coupled in the connector device according to the first embodiment of the present invention.
Figure 5:
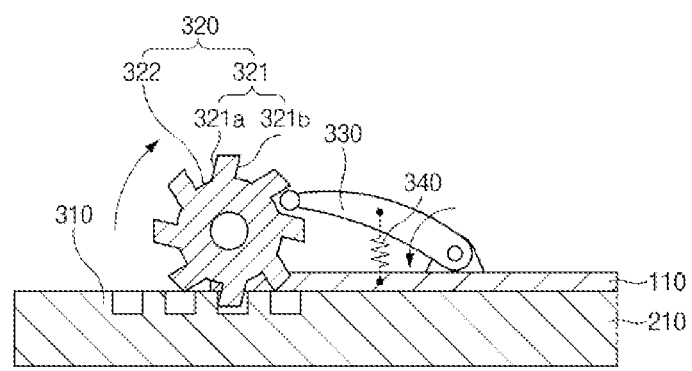
FIG. 5 is a side view illustrate a state after the ratchet part is coupled in the connector device according to the first embodiment of the present invention.

Here, referring to FIGS. 4 and 5, the ratchet gear 320 has, on the outer circumferential surface, a plurality of gear teeth 321 and grooves 322 between the gear teeth 321. In each of the gear teeth 321 engaging with the toothed gear 310, a surface, which faces a direction in which the second connector 200 is coupled to the first connector 100, (a right side surface of the gear tooth when viewed in FIG. 4) is formed as a vertical surface 321b, and a surface, which faces a direction in which the second connector 200 is separated from the first connector 100, (a left side surface of the gear tooth when viewed in FIG. 4) is formed as an inclined surface 321a.

Accordingly, referring to FIG. 4, as the stopper is guided along the inclined surface 321a, the ratchet gear 320 may rotate in the direction in which the second connector 200 is coupled to the first connector 100. Also, referring to FIG. 5, as the stopper is locked to the vertical surface 321b, the ratchet gear 320 may not rotate in the direction in which the second connector 200 is separated from the first connector 100.

Stopper

The stopper 330 has a structure by which the ratchet gear 320 is fixed so as not to rotate or unfixed so as to be rotatable. That is, as a front end of the stopper 330 is inserted into a groove 322 between gear teeth 321 of the ratchet gear 320, the ratchet gear 320 is allowed to rotate only in a direction in which the second connector 200 and the first connector 100 are coupled. Accordingly, without removing the stopper 330, the second connector 200 and the first connector 100 may be coupled, but the second connector 200 and the first connector 100 may not be uncoupled.

That is, when the ratchet gear 320 is rotated by the toothed gear 310 as the second connector 200 and the first connector 100 are coupled, the stopper 330 is guided along the inclined surface 321a provided in the gear tooth 321 of the ratchet gear 320 and continuously moves from a groove to another groove of the ratchet gear 320. Accordingly, the first connector 100 and the second connector 200 may be coupled even without removing the front end of the stopper 330 inserted into the ratchet gear 320.

That is, when the ratchet gear 320 is rotated by the toothed gear 310 as the second connector 200 and the first connector 100 are separated, the stopper 330 is locked to the vertical surface 321b provided in the gear tooth 321 of the ratchet gear 320 and prevents the rotation of the ratchet gear 320. Accordingly, the first connector 100 and the second connector 200 may be uncoupled without removing the front end of the stopper 330 inserted into the ratchet gear 320.

Spring

The spring 340 provides an elastic force to maintain a state in which the stopper 330 is inserted into the groove 322 between the gear teeth 321 of the ratchet gear 320. One end is fastened to the first connector 100, and the other end is fastened to one side of the front end of the stopper 330.

Meanwhile, the toothed gear 310 is formed on the outer surface of the socket body 210 from a point, at which the first connector 100 and the second connector 200 are coupled by 70% to 80%, to a point at which the coupling is completed. Accordingly, when the first connector 100 and the second connector 200 are uncoupled by 20% to 30%, the first connector 100 and the second connector 200 may be conveniently separated.

Hereinafter, a coupling method for the connector device according to the first embodiment of the present invention will be described in more detail.

When the first connector 100 and the second connector 200 are coupled, the ratchet gear 320 provided in the first connector 100 is rotated by the toothed gear 310 provided in the second connector 200. The ratchet gear 320 rotates in the direction in which the first connector 100 and the second connector 200 are coupled. Here, the ratchet gear 320 rotates while pushing the front end of the stopper 330 outward from the groove 322 between the gear teeth 321 of the ratchet gear 320, and accordingly, the ratchet gear 320 may continuously rotate without interference by the stopper 330. That is, the front end of the stopper 330 is guided along the inclined surface 321a provided in the gear tooth 321 of the ratchet gear 320, and thus, does not interfere the rotation of the ratchet gear 320. Also, the stopper 330 continuously moves from a groove 322 to another groove 322 between the gear teeth 321 of the ratchet gear 320 while being pulled in a direction toward the ratchet gear 302 by the elastic force of the spring 340. Thus, the first connector 100 and the second connector 200 may be coupled even without removing the stopper 330 inserted into the ratchet gear 320.

When the first connector 100 and the second connector 200 are separated in a state in which the stopper 330 is inserted into the groove 322 between the gear teeth 321 of the ratchet gear 320, the ratchet gear 320 is rotated by the toothed gear 310 in a direction in which the first connector 100 and the second connector 200 are separated. Here, the ratchet gear 320 does not rotate because not pushes the front end of the stopper 330 outward from the groove 322 between the gear teeth 321 of the ratchet gear 320, that is, because the front end of the stopper 330 does not escape from the groove 322 between the gear teeth 321 of the ratchet gear 320. In other words, as the front end of the stopper 330 is locked to the vertical surface 321b provided in the gear tooth 321 of the ratchet gear 320, the ratchet gear 320 does not rotate. Thus, the first connector 100 and the second connector 200 may not be separated in a state in which the stopper 330 is inserted into the ratchet gear 320.

When the first connector 100 and the second connector 200 are separated in a state in which the stopper 330 escapes from the groove 322 between the gear teeth 321 of the ratchet gear 320, the ratchet gear 320 continuously rotates because the stopper 330 escapes from the groove between the gear teeth of the ratchet gear 320, and the toothed gear 310 is moved by the rotation of f the ratchet gear 320. Thus, the first connector 100 and the second connector 200 may be separated in the state in which the stopper 330 escapes from the groove 322 between the gear teeth 321 of the ratchet gear 320.

The connector device having the above configuration according to the first embodiment of the present invention may couple the first connector and the second connector so as not to be easily separated or uncouple the first connector and the second connector so as to be conveniently separable.

Hereinafter, in describing another embodiment of the present invention, components having the same functions as those in the foregoing embodiment are given the same reference numerals, and their duplicated descriptions will be omitted.

Connector Device According to a Second Embodiment of the Present Invention

Figure 6:
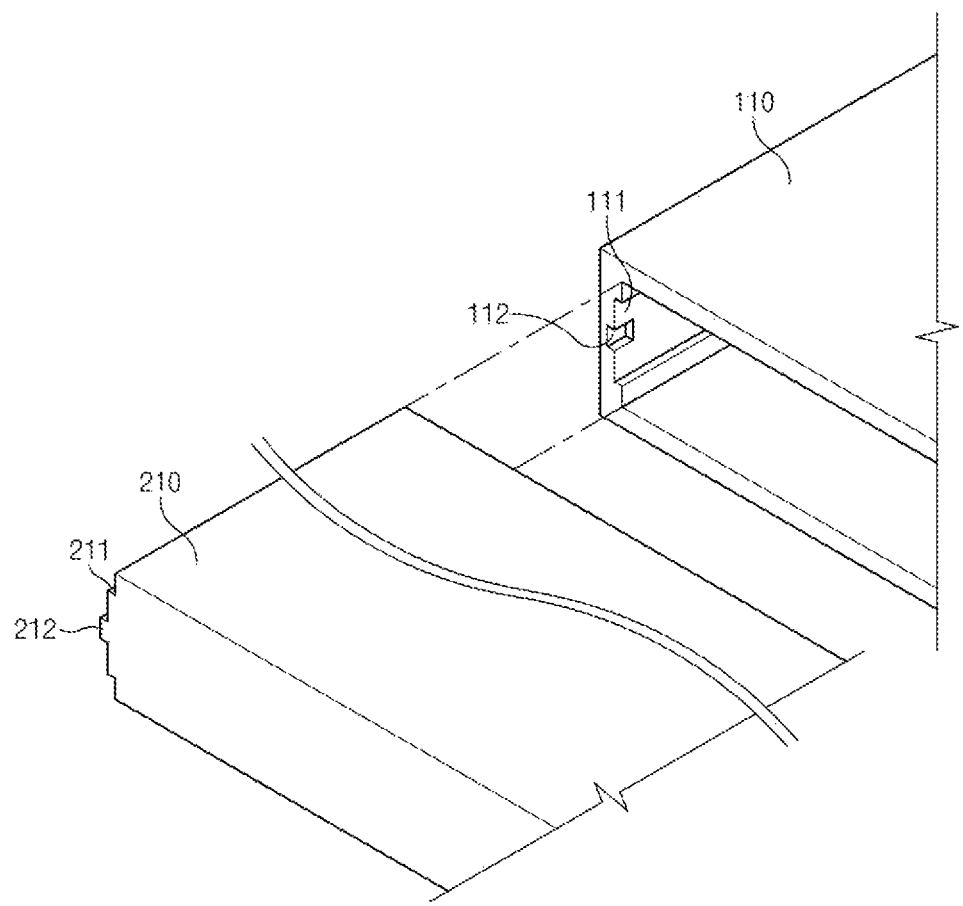
FIG. 6 is a perspective view illustrating a connector device according to a second embodiment of the present invention.

As illustrated in FIG. 6, the connector device according to the second embodiment of the present invention comprises a first connector 100 provided with a terminal body 110 and a second connector 200 provided with a socket body 210.

Here, a guide groove 111 is formed inside the terminal body 110, and a guide protrusion 211 guided along the guide groove 111 is formed in the socket body 210.

Thus, the connector device according to the second embodiment of the present invention comprises the guide groove 111 and the guide protrusion 211, and thus, the first connector 100 and the second connector 200 may be stably coupled or separated.

Meanwhile, a locking groove 112 connected to the guide groove 111 is formed in one surface of the terminal body 110 in which the guide groove 111 is formed, and a locking protrusion 212 locked and supported by the locking groove 112 is formed in the guide protrusion 211.

Thus, in the connector device according to the second embodiment of the present invention, the locking protrusion 212 is locked to the locking groove 112 at a set coupling point between the first connector 100 and the second connector 200. Accordingly, it is possible to prevent the first connector 100 and the second connector 200 from being coupled beyond the set coupling point. As a result, it is possible to prevent damage which is likely to occur as the first connector 100 and the second connector 200 are coupled excessively.

Connector Device According to a Third Embodiment of the Present Invention

Figure 7:
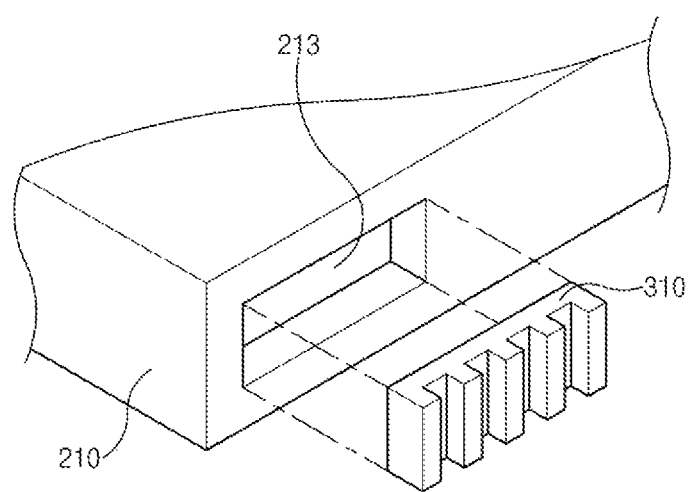
FIG. 7 is a perspective view illustrating a connector device according to a third embodiment of the present invention.

As illustrated in FIG. 7, the connector device according to the third embodiment of the present invention comprises a socket body 210 and a toothed gear 310. The toothed gear 310 is detachably installed on the socket body 210.

That is, the toothed gear 310 may be coupled to or separated from a coupling groove 213 formed in the socket body 210.

Thus, in the connector device according to the third embodiment of the present invention, the toothed gear is detachably coupled to the socket body, and thus, the device may be reused only by replacing a toothed gear worn down by engagement with the ratchet gear. As a result, the easiness of maintenance and repair may be enhanced. Particularly, the toothed gear may be made of a material having higher strength than the socket body, and thus, the use cycle may be significantly extended.

Connector Device According to a Fourth Embodiment of the Present Invention

Figure 8:
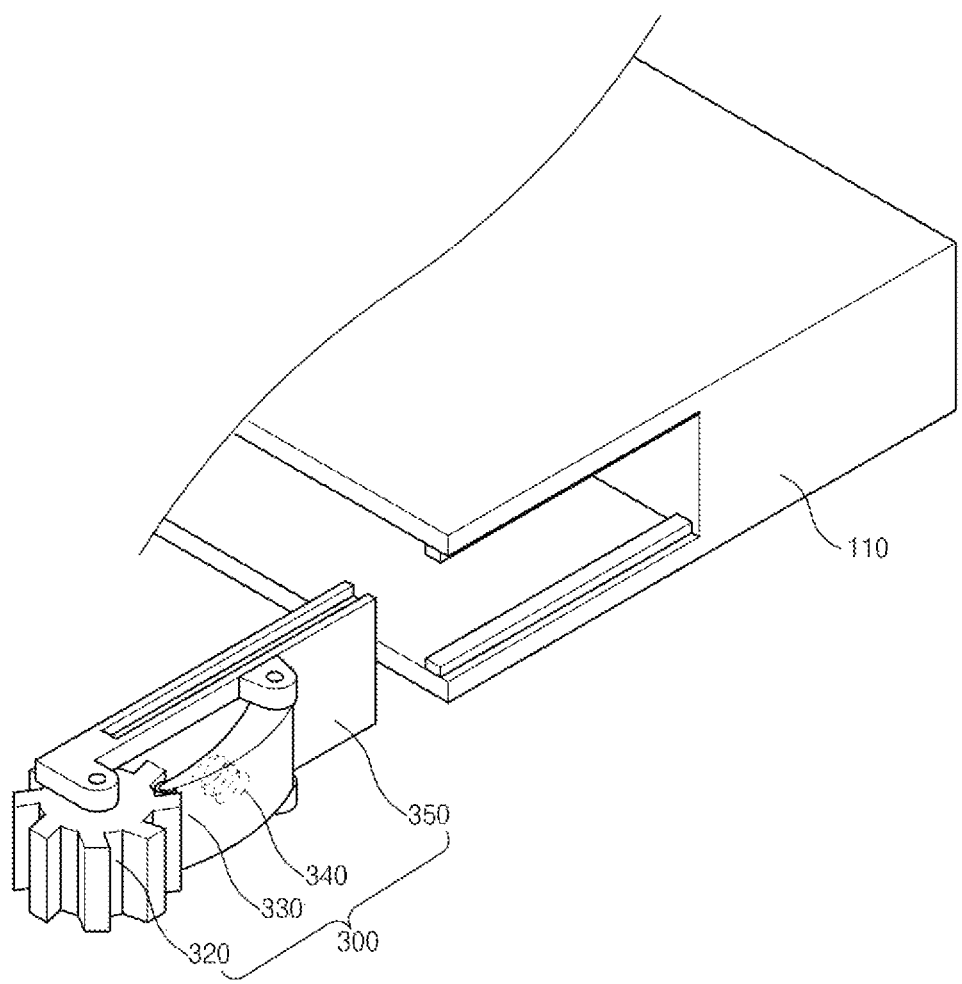
FIG. 8 is a perspective view illustrating a connector device according to a fourth embodiment of the present invention.

As illustrated in FIG. 8, the connector device according to the fourth embodiment of the present invention comprises a ratchet part 300. The ratchet part 300 comprises a ratchet body 350 on which a ratchet gear 320, a stopper 330, and a spring 340 are installed, and the ratchet body 350 is detachably coupled to a terminal body 110.

That is, the ratchet body 350 is inserted into a guide space formed in the ratchet body 350 and coupled thereto, or separated therefrom.

Thus, in the connector device according to the fourth embodiment of the present invention, when any one of the ratchet gear 320, the stopper 330, and the spring 340 is out of order, the ratchet body 350 is separated from the terminal body 110. Then, a new ratchet body may be coupled to the terminal body 110, and as a result, the easiness of maintenance and repair may be enhanced.

Connector Device According to a Fifth Embodiment of the Present Invention

Figure 9:
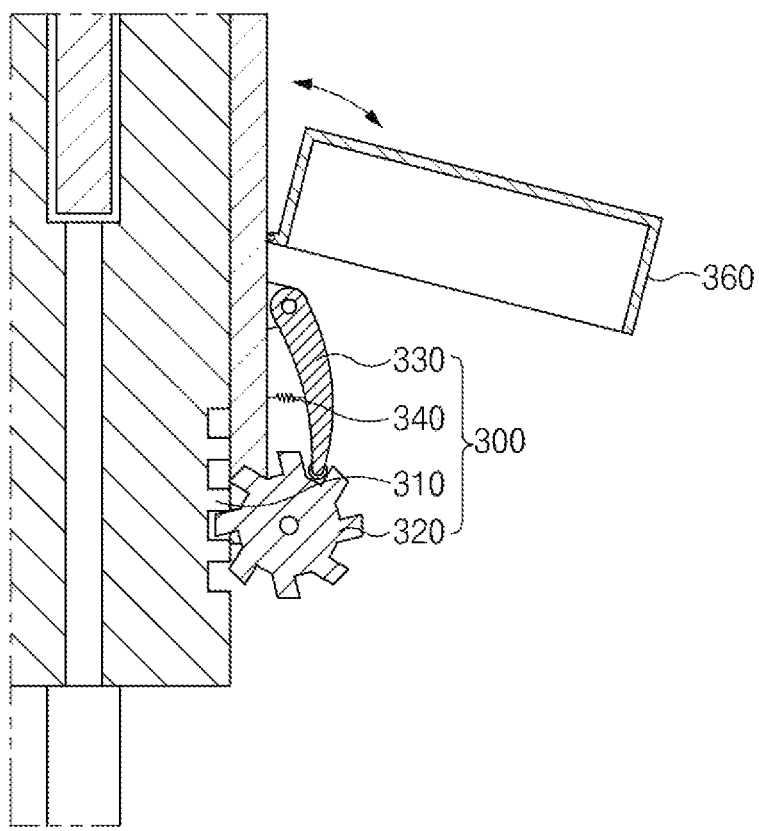
FIG. 9 is a side view illustrating a connector device according to a fifth embodiment of the present invention.

As illustrated in FIG. 9, the connector device according to the fifth embodiment of the present invention comprises a ratchet part 300. The ratchet part 300 comprises a ratchet gear 320, a stopper 330, and a spring 340 which are provided in a terminal body 110.

Particularly, the terminal body 110 comprises a protection cover 360 that protects the ratchet gear 320, the stopper 330, and the spring 340, and one end of the protection cover 360 is rotatably coupled to the terminal body 110. That is, the protection cover 360 may protect the ratchet gear 320, the stopper 330, and the spring 340 or may cancel protection.

Thus, the connector device according to the fifth embodiment of the present invention comprises the protection cover, and thus, the ratchet gear 320, the stopper 330, and the spring 340, which are provided in the terminal body 110, may be more stably protected.

Connector Device According to a Sixth Embodiment of the Present Invention

Figure 10:
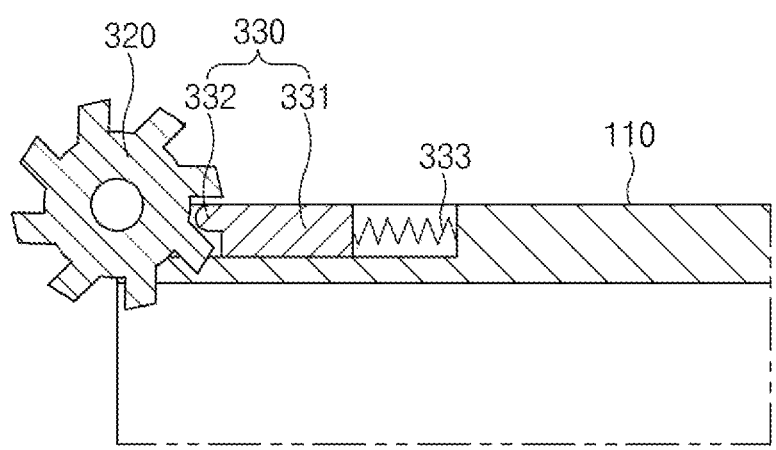
FIG. 10 is a cross-sectional view illustrating a connector device according to a sixth embodiment of the present invention.

As illustrated in FIG. 10, the connector device according to the sixth embodiment of the present invention comprises a stopper 330. The stopper 330 comprises a guide piece 331 which is installed on an outer circumferential surface of the terminal body 110 and is slidable in a direction toward the ratchet gear 320 and a fixing piece 332 which is inserted into a groove 322 between gear teeth 321 of the ratchet gear 320 and fixes the ratchet gear 320 so as not to rotate.

That is, when the guide piece 331 moves in a direction away from the ratchet gear 320, the stopper 330 may allow the ratchet gear 320 to rotate as the fixing piece 332 escapes from the groove 322 between the gear teeth 321 of the ratchet gear 320. That is, when the guide piece 331 moves in a direction closer to the ratchet gear 320, the ratchet gear 320 may be fixed so as not to rotate, as the fixing piece 332 is inserted into the groove 322 between the gear teeth 321 of the ratchet gear 320.

Thus, the connector device according to the sixth embodiment of the present invention comprises the stopper that is provided with the guide piece and the fixing piece, and thus, the ratchet gear may be more conveniently fixed or rotated.

Meanwhile, the connector device according to the sixth embodiment of the present invention may further comprise a spring 333 that provides an elastic force so that stopper 330 is directed toward the ratchet gear 320.

The scope of the present invention is defined by the appended claims rather than the detailed description, and various embodiments derived from the meaning and scope of the claims and their equivalent concepts are also possible.

DESCRIPTION OF THE SYMBOLS

10: Substrate
20: Electric wire
100: First connector
100a: Opening
110: Terminal body
111: Guide groove
112: Locking groove
120: Terminal
200: Second connector
210: Socket body
211: Guide protrusion
212: Locking protrusion
220: Socket
300: Ratchet part
310: Toothed gear
320: Ratchet gear
321: Gear tooth
321a: Inclined surface
321b: Vertical surface
322: Groove
330: Stopper
331: Guide piece
332: Fixing piece 340: Spring
350: Ratchet body
360: Protection cover

The invention claimed is:

1. A connector device comprising:
a first connector coupled to a substrate, the first connector including a terminal body having an opening provided in one surface thereof and a terminal provided in the opening and electrically connected to the substrate;
a second connector coupled to an electric wire, the second connector including a socket body adapted to be inserted into the opening of the terminal body and a socket provided inside the socket body and configured to contact the terminal; and
a ratchet part by which the first connector and the second connector are coupled, the ratchet part configured to allow or prevent separation of the first connector and the second connector,
wherein the ratchet part comprises:
a toothed gear provided on an outer surface of the socket body and having teeth provided in a direction toward the terminal body when the socket body is inserted into the terminal body;
a ratchet gear provided in the terminal body and adapted to engage with the toothed gear, the ratchet gear configured to couple the first connector and the second connector such that the first and second connectors cannot be separated when the ratchet gear is fixed and the first and second connectors can be uncoupled when the ratchet gear is permitted to rotate; and
a stopper configured to fix the ratchet gear to prevent rotation or unfix the ratchet gear to allow rotation,
wherein the ratchet part further comprises a spring configured to provide an elastic force to maintain a state in which the stopper is inserted into a groove between gear teeth of the ratchet gear.

2. The connector device of claim 1, wherein, as a front end of the stopper is inserted into a groove between gear teeth of the ratchet gear, the ratchet gear is allowed to rotate only in a direction in which the second connector and the first connector are coupled.

3. The connector device of claim 1, wherein, when the first connector and the second connector are coupled, the ratchet gear is rotated by the toothed gear in a direction in which the first connector and the second connector are coupled,
wherein the ratchet gear is configured to rotate while pushing the front end of the stopper outward from the groove between the gear teeth of the ratchet gear, and the stopper continuously moves from a groove to another groove between the gear teeth of the ratchet gear while being pulled in a direction toward the ratchet gear by the elastic force of the spring.

4. The connector device of claim 1, wherein, when the first connector and the second connector are separated in a state in which the stopper is inserted into the groove between the gear teeth of the ratchet gear, the ratchet gear is configured to be rotated by the toothed gear in a direction in which the first connector and the second connector are separated,
wherein the ratchet gear presses the front end of the stopper inward from the groove between the gear teeth of the ratchet gear to prevent rotation of the ratchet gear and prevent separation of the first connector and the second connector.

5. The connector device of claim 1, wherein, when the first connector and the second connector are separated in a state in which the stopper is not disposed in the groove between the gear teeth of the ratchet gear, the ratchet gear is configured to continuously rotate, and as the toothed gear is moved by rotation of the ratchet gear, the first connector and the second connector are separated.

6. The connector device of claim 1, wherein the ratchet part further comprises a ratchet body which is detachably coupled to the terminal body and on which the ratchet gear, the stopper, and the spring are installed.

7. The connector device of claim 1, wherein a guide groove is formed inside the terminal body, and a guide protrusion extending along the guide groove is formed in the socket body.

8. The connector device of claim 7, wherein a locking groove connected to the guide groove is formed in one surface of the terminal body in which the guide groove is formed, and
a locking protrusion configured to be locked and supported by the locking groove is formed in the guide protrusion.

9. The connector device of claim 1, wherein the toothed gear is detachably installed on the socket body.

10. The connector device of claim 1, wherein the first connector further comprises a protection cover configured to protects the ratchet gear and the stopper provided in the terminal body.

11. The connector device of claim 10, wherein one end of the protection cover is rotatably coupled to the terminal body.

12. The connector device of claim 1, wherein the stopper comprises a guide piece, which is installed on an outer circumferential surface of the terminal body and is slidable in a direction toward the ratchet gear, and a fixing piece, which is configured to be inserted into a groove between gear teeth of the ratchet gear and configured to fix the ratchet gear to prevent rotation.

13. A connector device comprising:
a first connector coupled to a substrate, the first connector including a terminal body having an opening provided in one surface thereof and a terminal provided in the opening and electrically connected to the substrate;
a second connector coupled to an electric wire, the second connector including a socket body adapted to be inserted into the opening of the terminal body and a socket provided inside the socket body and configured to contact the terminal; and
a ratchet part by which the first connector and the second connector are coupled, the ratchet part configured to allow or prevent separation of the first connector and the second connector,
wherein the ratchet part comprises:
a toothed gear provided on an outer surface of the socket body and having teeth provided in a direction toward the terminal body when the socket body is inserted into the terminal body;
a ratchet gear provided in the terminal body and adapted to engage with the toothed gear, the ratchet gear configured to couple the first connector and the second connector such that the first and second connectors cannot be separated when the ratchet gear is fixed and the first and second connectors can be uncoupled when the ratchet gear is permitted to rotate; and
a stopper configured to fix the ratchet gear to prevent rotation or unfix the ratchet gear to allow rotation,
wherein, as a front end of the stopper is inserted into a groove between gear teeth of the ratchet gear, the ratchet gear is allowed to rotate only in a direction in which the second connector and the first connector are coupled.

14. A connector device comprising:

a first connector coupled to a substrate, the first connector including a terminal body having an opening provided in one surface thereof and a terminal provided in the opening and electrically connected to the substrate;

a second connector coupled to an electric wire, the second connector including a socket body adapted to be inserted into the opening of the terminal body and a socket provided inside the socket body and configured to contact the terminal; and a ratchet part by which the first connector and the second connector are coupled, the ratchet part configured to allow or prevent separation of the first connector and the second connector, wherein the ratchet part comprises:

a toothed gear provided on an outer surface of the socket body and having teeth provided in a direction toward the terminal body when the socket body is inserted into the terminal body;

a ratchet gear provided in the terminal body and adapted to engage with the toothed gear, the ratchet gear configured to couple the first connector and the second connector such that the first and second connectors cannot be separated when the ratchet gear is fixed and the first and second connectors can be uncoupled when the ratchet gear is permitted to rotate; and a stopper configured to fix the ratchet gear to prevent rotation or unfix the ratchet gear to allow rotation, wherein the first connector further comprises a protection cover configured to protects the ratchet gear and the stopper provided in the terminal body.

* * * * *